United States Patent
Xiong

(10) Patent No.: US 12,089,496 B2
(45) Date of Patent: Sep. 10, 2024

(54) FLUORESCENT MATERIAL AND ELECTROLUMINESCENT DEVICE

(71) Applicants: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(72) Inventor: You Xiong, Wuhan (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 565 days.

(21) Appl. No.: 17/434,827

(22) PCT Filed: Jul. 21, 2021

(86) PCT No.: PCT/CN2021/107539
§ 371 (c)(1),
(2) Date: Aug. 30, 2021

(87) PCT Pub. No.: WO2022/262063
PCT Pub. Date: Dec. 22, 2022

(65) Prior Publication Data

US 2023/0345832 A1 Oct. 26, 2023

(30) Foreign Application Priority Data

Jun. 16, 2021 (CN) .......................... 202110665002.2

(51) Int. Cl.
*H01L 51/00* (2006.01)
*C07F 5/02* (2006.01)
(Continued)

(52) U.S. Cl.
CPC ........... *H10K 85/658* (2023.02); *C07F 5/027* (2013.01); *C09K 11/02* (2013.01); *C09K 11/06* (2013.01);
(Continued)

(58) Field of Classification Search
CPC ............. C07F 5/027; C09K 2211/1014; C09K 2211/1022; H10K 85/658
See application file for complete search history.

(56) References Cited

U.S. PATENT DOCUMENTS

2020/0203651 A1* 6/2020 Duan .................... H10K 50/12
2020/0274075 A1* 8/2020 Park .................... H10K 85/657
(Continued)

*Primary Examiner* — Alexander C Kollias
(74) *Attorney, Agent, or Firm* — The Roy Gross Law Firm, LLC; Roy Gross

(57) ABSTRACT

A fluorescent material is provided. The fluorescent material has a molecular structure of electron donors in combination with electron acceptors. Based on the structure of triphenyl borane and triphenyl amine, by adjusting the structure of different electron-donating units, the overall charge transfer strength is adjusted, and the electron-donating ability is changed, so as to obtain the fluorescent material having a lower energy level difference between singlet and triplet states, a higher luminous efficiency, and an accelerated reverse intersystem crossing constant, thereby obtaining a electroluminescent device with a high luminous efficiency.

20 Claims, 1 Drawing Sheet

(51) Int. Cl.
    *C09K 11/02*     (2006.01)
    *C09K 11/06*     (2006.01)
    *H10K 85/60*     (2023.01)
    *H10K 50/12*     (2023.01)

(52) U.S. Cl.
    CPC .............. *C09K 2211/1007* (2013.01); *C09K 2211/1014* (2013.01); *C09K 2211/1022* (2013.01); *H10K 50/121* (2023.02)

(56) References Cited

U.S. PATENT DOCUMENTS

| | | | |
|---|---|---|---|
| 2020/0388770 A1* | 12/2020 | Lee | H10K 85/322 |
| 2021/0376249 A1* | 12/2021 | Akashi | C07B 59/004 |
| 2022/0017545 A1* | 1/2022 | Han | H10K 85/657 |
| 2023/0416278 A1* | 12/2023 | Wolleb | H10K 85/658 |

* cited by examiner

FLUORESCENT MATERIAL AND ELECTROLUMINESCENT DEVICE

CROSS REFERENCE TO RELATED APPLICATIONS

This application is a National Phase of PCT Patent Application No. PCT/CN2021/107539 having International filing date of Jul. 21, 2021, which claims the benefit of priority of Chinese Patent Application No. 202110665002.2, filed Jun. 16, 2021, the contents of which are all incorporated herein by reference in their entirety.

FIELD OF INVENTION

The present disclosure relates to a display technical field, and specifically, to a fluorescent material and an electroluminescent device.

BACKGROUND OF INVENTION

Organic light emitting diodes (OLEDs) have advantages of active illumination without backlight, high luminous efficiency, wide viewing angles, fast response speed, large ranges of temperature adaptation, relatively simple production and processing technology, low driving potential, low energy consumption, light weight, and flexible display, so that the OLEDs have great application prospects and attract the attention of many researchers.

In an OLED, the most important thing is a luminescent guest material which plays a leading role. The luminescent guest material used in early OLEDs was fluorescent material. Because the ratio of singlet to triplet excitons in the OLED is 1:3, the theoretical internal quantum efficiency (IQE) of the OLED based on fluorescent materials can only reach 25%, which greatly limits the application of the fluorescent electroluminescent device. Another luminescent guest material is a heavy metal complex phosphorescent material which can utilize both of excitons of the singlet exited state and the triplet exited state due to its spin-orbit interaction of the heavy atoms, so that the IQE can reach 100% in theory. However, the phosphorescence-based material usually requires the precious metals such as Ir and Pt. When used in blue light material, the heavy metal complex phosphorescent material needs a breakthrough. Other luminescent guest material, such as pure organic thermally activated delayed fluorescence (TADF) material which has a designated molecular structure with a relatively smaller lowest energy level difference ($\Delta E_{ST}$) between the singlet and triplet states to allow triplet excited excitons to return to the singlet excited state through reverse intersystem crossing (RISC), and then transition back to the ground state by radiation to illuminate. Thereby, the singlet and triplet excitons can be utilized at the same time, and the IQE can also reach 100%. For TADF materials, an accelerated reverse intersystem crossing constant ($k_{RISC}$) and a high photoluminescence quantum yield (PLQY) are necessary for the preparation of high efficiency OLEDs. However, TADF materials with the above requirements are still relatively scarce, compared to heavy metal Ir complex materials. In the field of blue light where phosphorescent heavy metal materials need a breakthrough, TADF materials are even scarce.

It is therefore necessary to provide a fluorescent material and an electroluminescent device in order to solve the problems existing in the conventional technology as described above.

SUMMARY OF DISCLOSURE

Technical Problem

The electroluminescent device produced by the current fluorescent material has a technical problem of low luminous efficiency.

Technical Solutions

One embodiment of the present disclosure provides a fluorescent material, having a structural formula of:

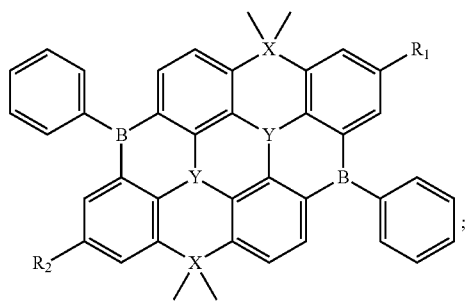

wherein $R_1$ is selected from the group consisting of

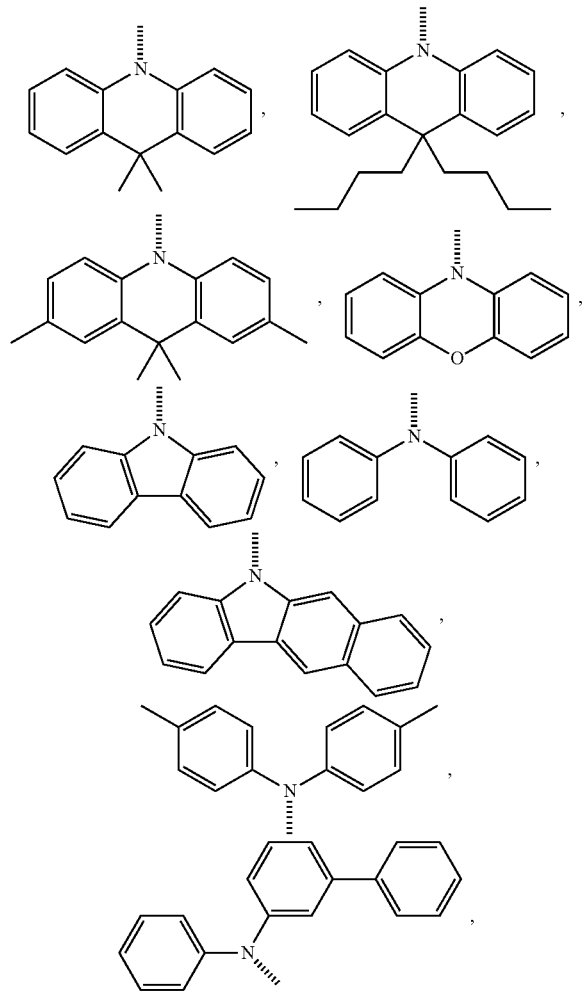

-continued

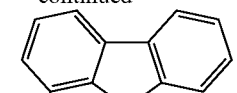

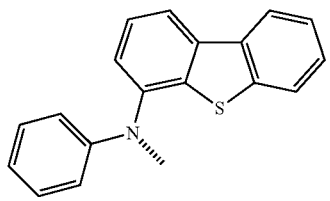

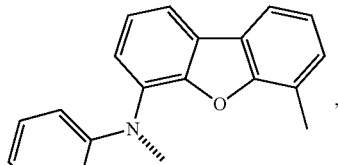

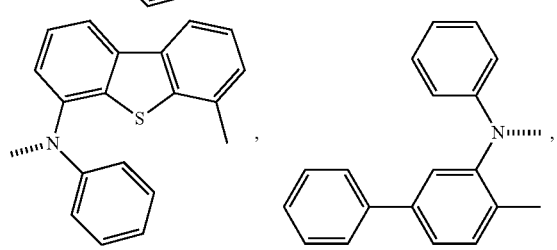

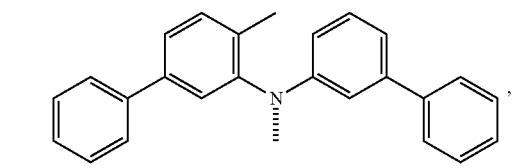

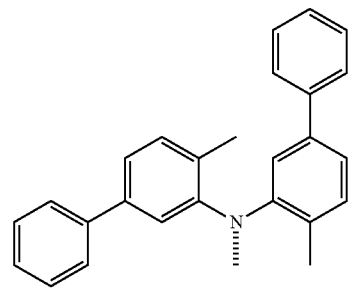

and any of derivatives thereof;

R$_2$ is selected from the group consisting of a hydrogen atom, a fluorine atom, a methyl group, a cyano group, a tert-butyl group, a phenyl group, a pyridine group, a 1,3,5-triazine group, and any of derivatives thereof;

X is any one of a carbon atom and a silicon atom; and Y is any one of a nitrogen atom and a phosphorus atom.

In the fluorescent material provided by one embodiment of the present disclosure, the fluorescent material includes a first target compound having a structural formula of:

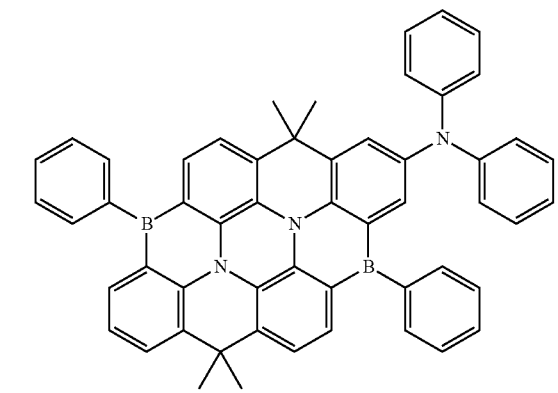

In the fluorescent material provided by one embodiment of the present disclosure, the first target compound is synthesized by the following synthetic route:

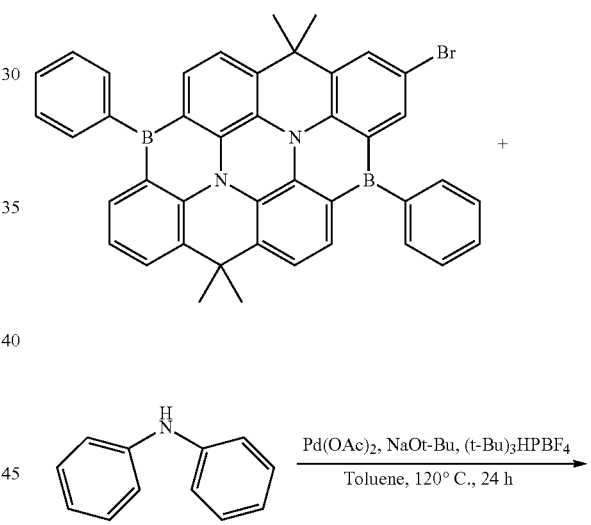

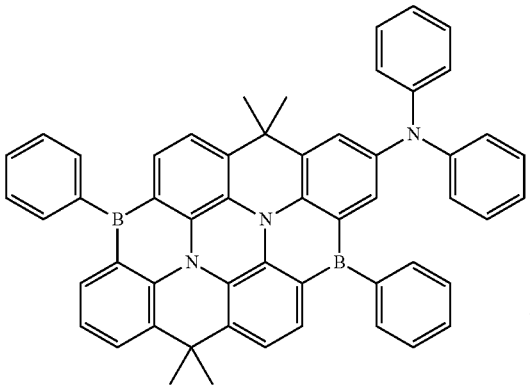

In the fluorescent material provided by one embodiment of the present disclosure, the fluorescent material includes a second target compound having a structural formula of:

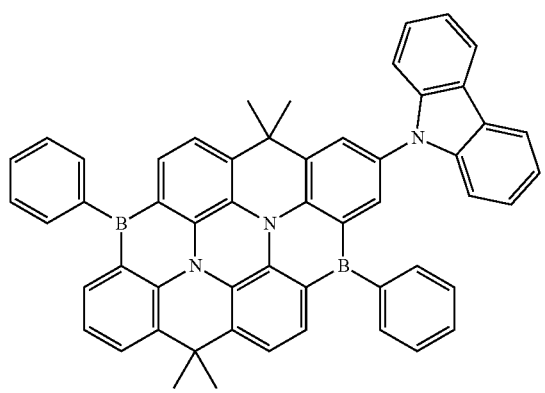

In the fluorescent material provided by one embodiment of the present disclosure, the second target compound is synthesized by the following synthetic route:

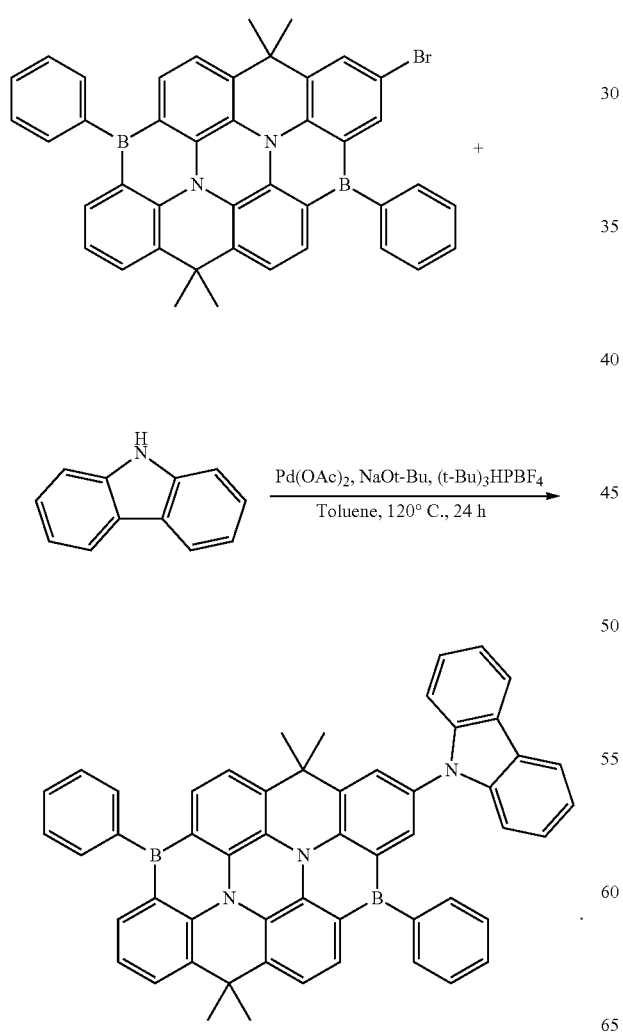

In the fluorescent material provided by one embodiment of the present disclosure, the fluorescent material includes a third target compound having a structural formula of

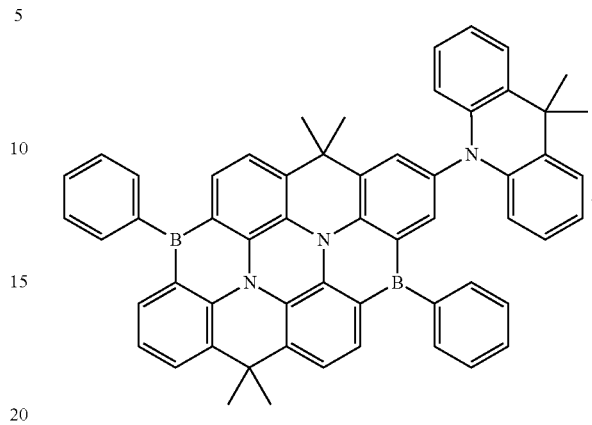

In the fluorescent material provided by one embodiment of the present disclosure, the third target compound is synthesized by the following synthetic route:

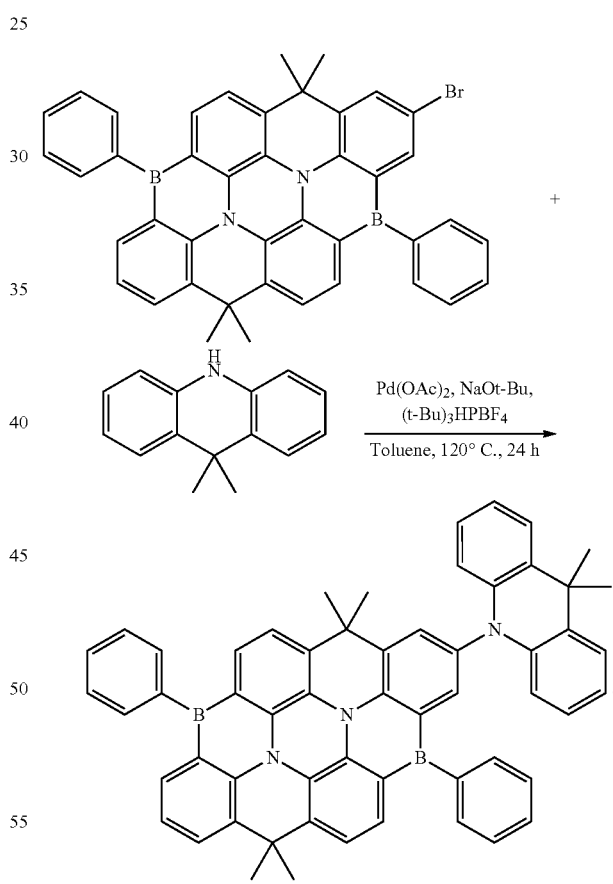

In the fluorescent material provided by one embodiment of the present disclosure, the third target compound has a blue emission peak at 463 nm, the third target compound has a lowest singlet state at 2.68 eV, the third target compound has a lowest triplet state at 2.6 eV, and the third target compound has a lowest energy level difference between singlet and triplet states of 0.08 Ev.

Accordingly, one embodiment of the present disclosure further provides an electroluminescent device, wherein the electroluminescent device includes a light-emitting layer, and a material of the light-emitting layer includes a fluorescent material having a structural formula of:

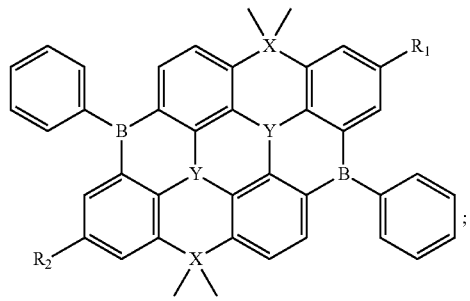

wherein, $R_1$ is selected from the group consisting of

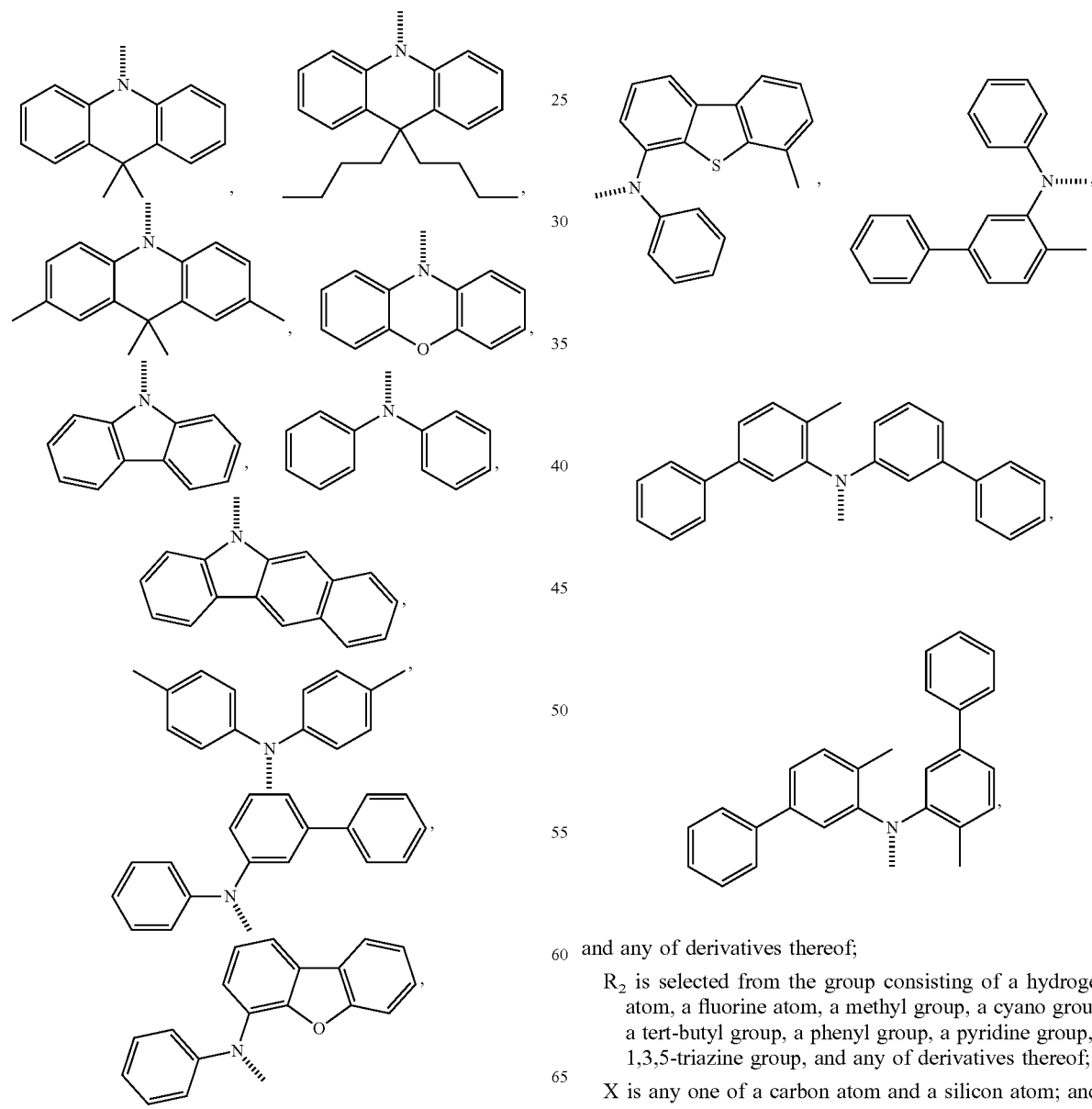

and any of derivatives thereof;

$R_2$ is selected from the group consisting of a hydrogen atom, a fluorine atom, a methyl group, a cyano group, a tert-butyl group, a phenyl group, a pyridine group, a 1,3,5-triazine group, and any of derivatives thereof;

X is any one of a carbon atom and a silicon atom; and

Y is any one of a nitrogen atom and a phosphorus atom.

In the fluorescent material provided by one embodiment of the present disclosure, the fluorescent material includes a first target compound having a structural formula of:

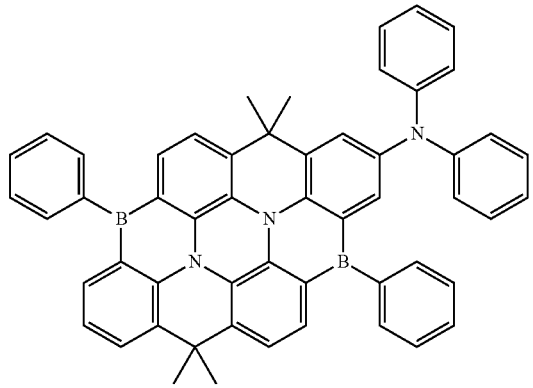

In the fluorescent material provided by one embodiment of the present disclosure, a synthetic route of the first target compound is:

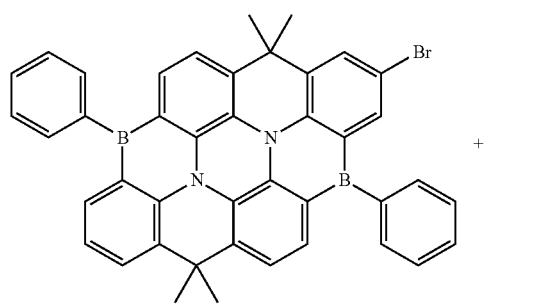

+

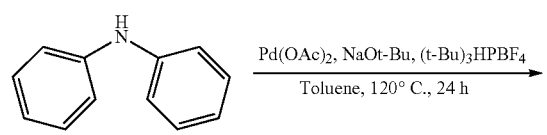

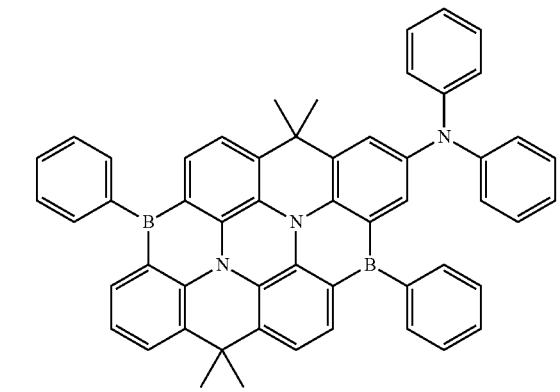

In the fluorescent material provided by one embodiment of the present disclosure, the fluorescent material includes a second target compound having a structural formula of

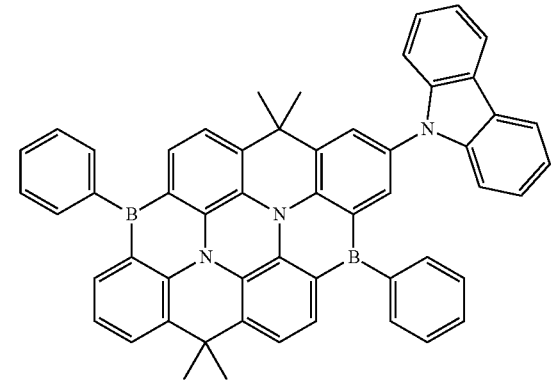

In the fluorescent material provided by one embodiment of the present disclosure, a synthetic route of the second target compound is:

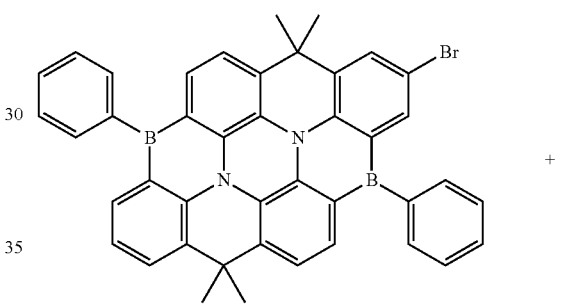

+

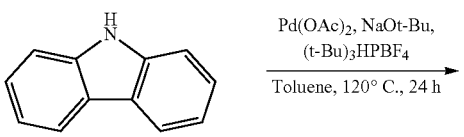

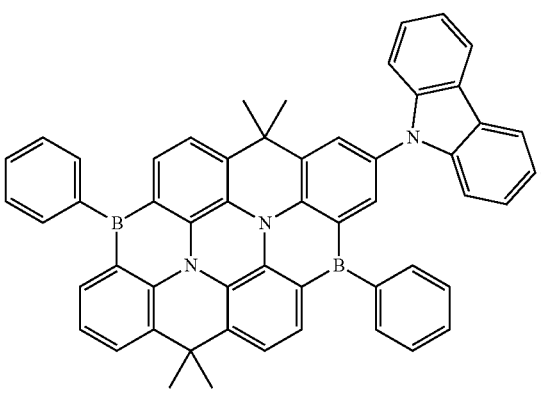

In the fluorescent material provided by one embodiment of the present disclosure, the fluorescent material includes a third target compound having a structural formula of

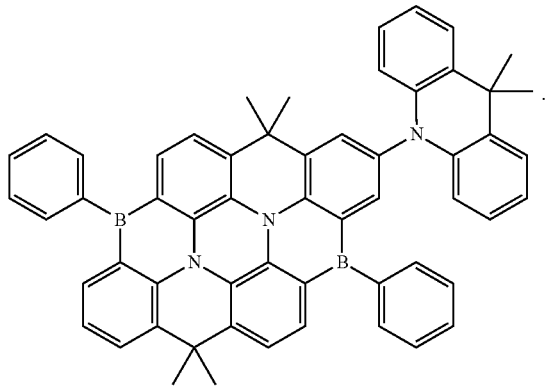 [SMILES: CC1(C)c2ccccc2N(c2cc3c4c(c2)C(C)(C)c2ccc5c6c2N4c2c(ccc4c2N6c2c(cccc2C4(C)C)B5c2ccccc2)B3c2ccccc2)c2ccccc21]

In the fluorescent material provided by one embodiment of the present disclosure, the third target compound is synthesized by the following synthetic route:

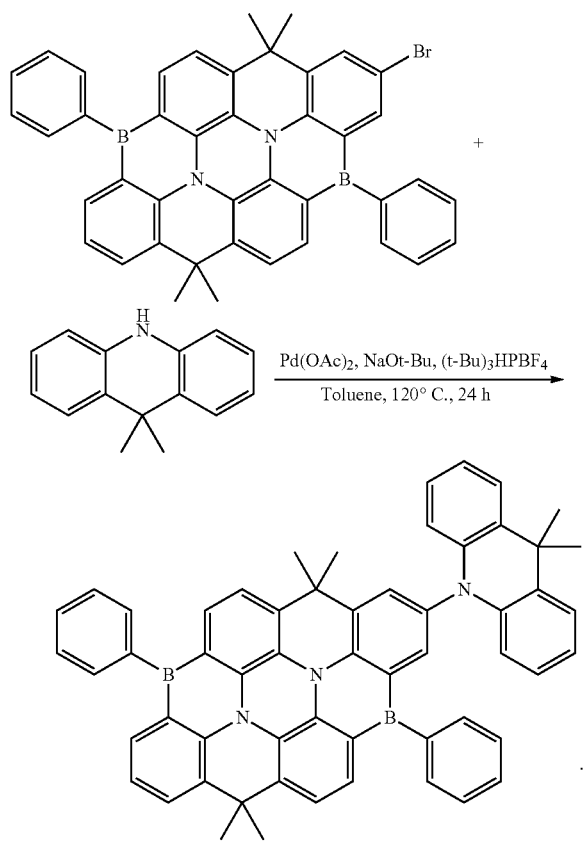

In the fluorescent material provided by one embodiment of the present disclosure, the third target compound has a blue emission peak at 463 nm, the third target compound has a lowest singlet state at 2.68 eV, the third target compound has a lowest triplet state at 2.6 eV, and the third target compound has a lowest energy level difference between singlet and triplet states of 0.08 Ev.

In the fluorescent material provided by one embodiment of the present disclosure, the electroluminescent device further includes:
  a substrate layer;
  a hole injection layer disposed on a side surface of the substrate layer;
  a hole transport layer disposed on a side surface of the hole injection layer away from the substrate layer;
  the light-emitting layer disposed on a side surface of the hole transport layer away from the hole injection layer;
  an electron transport layer disposed on a side surface of the light-emitting layer away from the hole transport layer; and
  a cathode layer disposed on a side surface of the electron transport layer away from the light-emitting layer.

In the fluorescent material provided by one embodiment of the present disclosure, a material of the substrate layer is indium tin oxide, a material of the hole injection layer is 1,4,5,8,9,11-hexaazabenzonitrile, a material of the hole transport layer is 4,4',4''-tris(carbazol-9-yl)triphenylamine, a material of the electron transport layer is 1,3,5-tris(3-(3-pyridyl)phenyl)benzene, and a material of the cathode layer is lithium fluoride/aluminum.

In the fluorescent material provided by one embodiment of the present disclosure, a material of the light-emitting layer includes a mixed material composed of bis[2-((oxo)diphenylphosphino)phenyl] ether and the third target compound, wherein the third target compound is 10% by mass of the mixed material.

In the fluorescent material provided by one embodiment of the present disclosure, a maximum external quantum efficiency of the electroluminescent device is 26.8%.

Beneficial Effect

Embodiments of the present disclosure provide a fluorescent material and an electroluminescent device. The fluorescent material is a blue-light thermally activated delayed fluorescent material. The blue-light thermally activated delayed fluorescent material has a molecular structure of electron donors in combination with electron acceptors. Upon collocation of different functional groups, based on the structure of triphenylborane and triphenyl amine, by adjusting the structure of different electron-donating units, the overall charge transfer strength is adjusted, and the electron-donating ability is changed, so as to obtain a series of blue-light thermally activated delayed fluorescent materials having a lower energy level difference between singlet and triplet states, a higher luminous efficiency, and an accelerated reverse intersystem crossing constant. Moreover, the electroluminescent devices produced by the target blue-light thermally activated delayed fluorescent materials all have extremely high luminous efficiency.

DETAILED DESCRIPTION OF PREFERRED EMBODIMENTS

Figure 1:
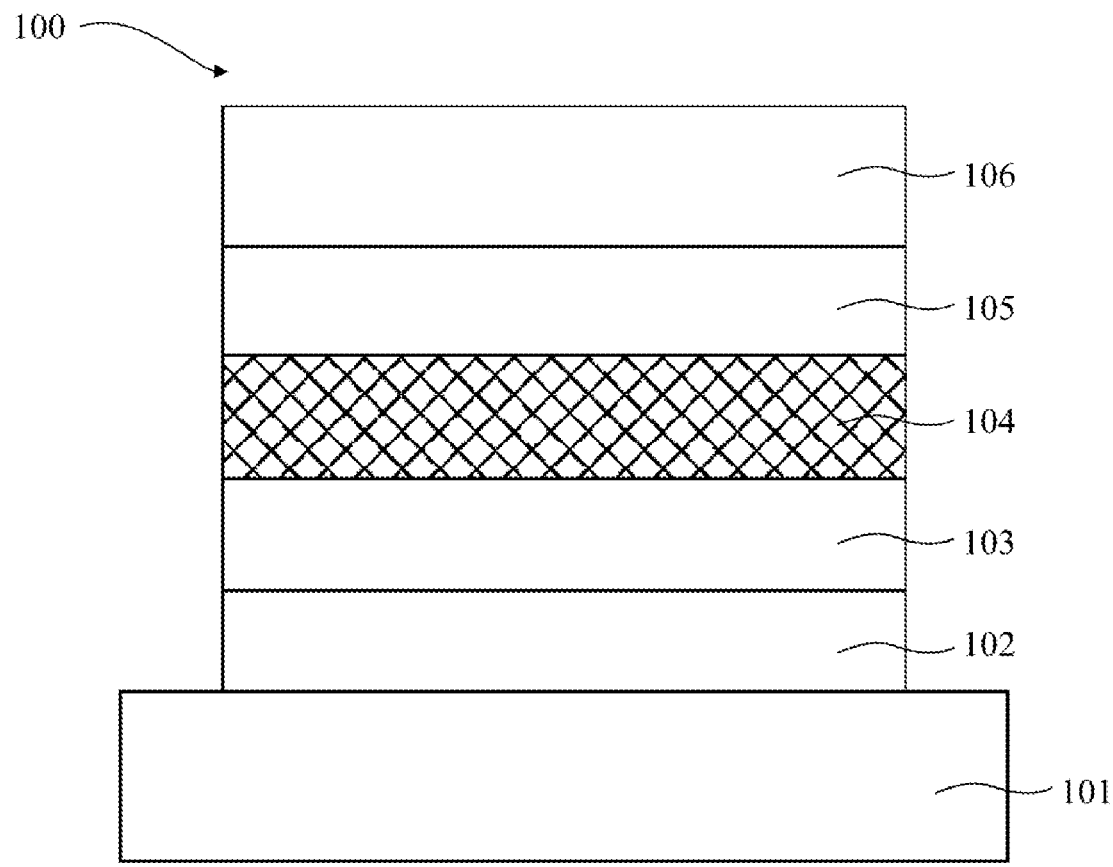
FIG. 1 is a cross-sectional schematic view of an electroluminescent device according to one embodiment of the present disclosure.

Embodiments of the present disclosure aim at the technical problem of low luminous efficiency of electroluminescent devices prepared by the current fluorescent materials. The embodiments of the present disclosure can solve the abovementioned defects.

One embodiment of the present disclosure provides a fluorescent material. The fluorescent material is a blue-light thermally activated delayed fluorescent material having a structural formula of:

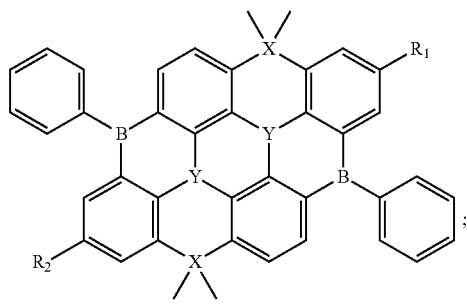

wherein, $R_1$ is selected from the group consisting of

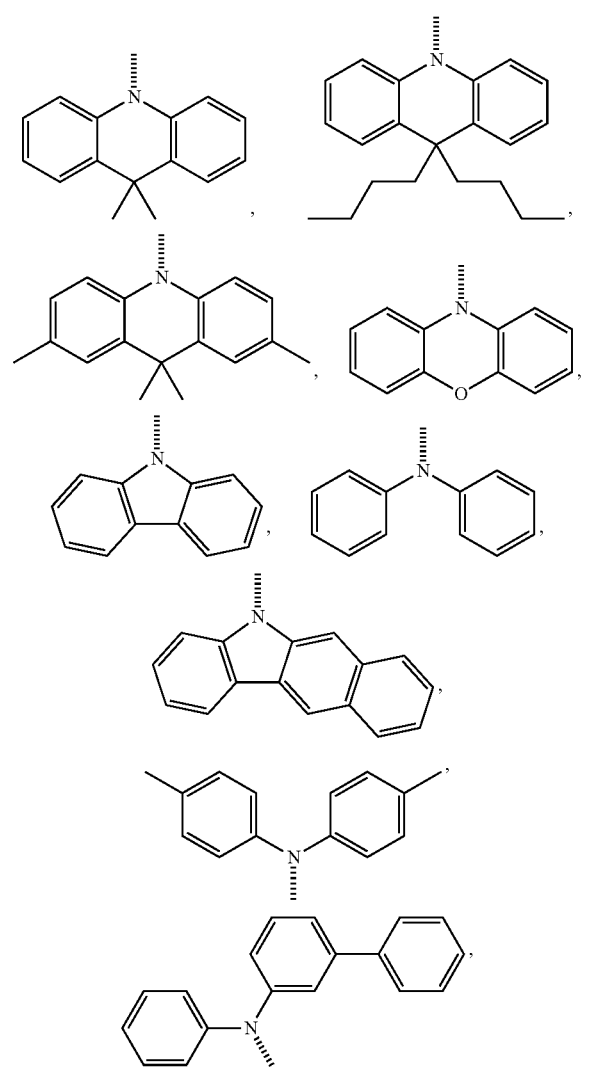

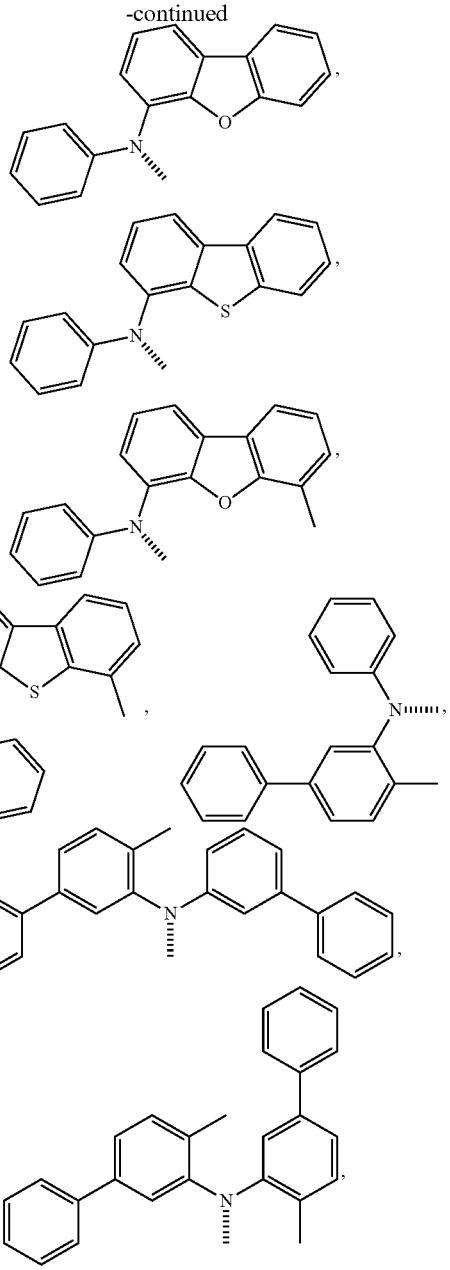

and any of derivatives thereof;

$R_2$ is selected from the group consisting of a hydrogen atom, a fluorine atom, a methyl group, a cyano group, a tert-butyl group, a phenyl group, a pyridine group, a 1,3,5-triazine group, and any of derivatives thereof;

X is any one of a carbon atom and a silicon atom; and Y is any one of a nitrogen atom and a phosphorus atom.

Embodiments of the present disclosure provide a blue-light thermally activated delayed fluorescent material. The blue-light thermally activated delayed fluorescent material has a molecular structure of electron donors in combination with electron acceptors. Upon collocation of different functional groups, based on the structure of triphenyl borane and triphenyl amine, by adjusting the structure of different electron-donating units, the overall charge transfer strength is adjusted, and the electron-donating ability is changed, so as to obtain a series of blue-light thermally activated delayed fluorescent materials having a lower energy level difference between singlet and triplet states, a higher luminous efficiency, and an accelerated reverse intersystem crossing constant. Moreover, the electroluminescent devices produced by the target blue-light thermally activated delayed fluorescent materials all have extremely high luminous efficiency.

The technical solution of present disclosure is described with reference to specific embodiments.

Embodiment 1

One embodiment of the present disclosure provides a fluorescent material. The fluorescent material is a blue-light thermally activated delayed fluorescent material having a structural formula of:

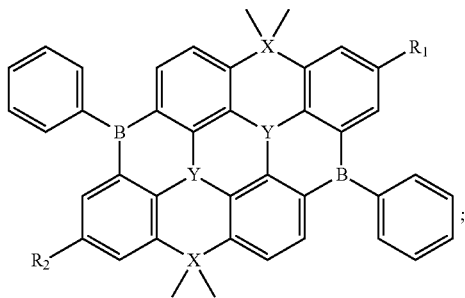

wherein, $R_1$ is selected from the group consisting of

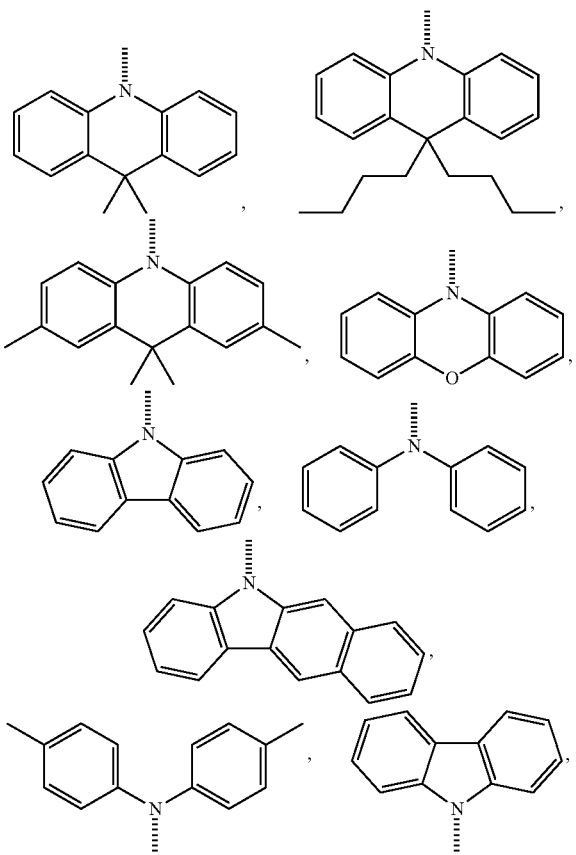

-continued

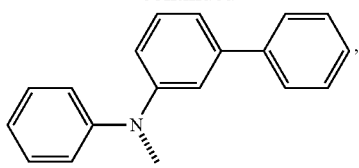

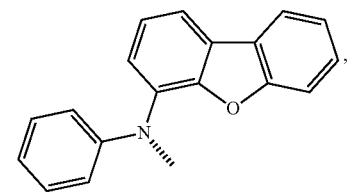

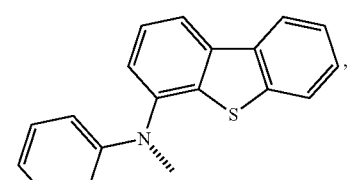

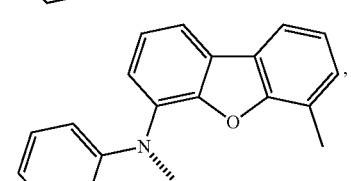

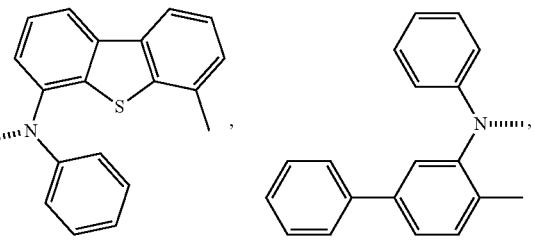

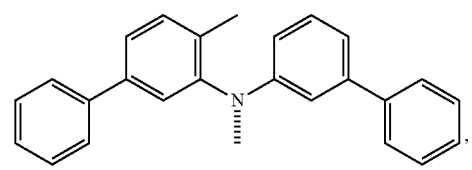

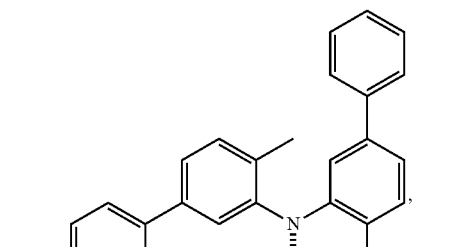

and any of derivatives thereof;

$R_2$ is selected from the group consisting of a hydrogen atom, a fluorine atom, a methyl group, a cyano group, a tert-butyl group, a phenyl group, a pyridine group, a 1,3,5-triazine group, and any of derivatives thereof;

X is any one of a carbon atom and a silicon atom; and Y is any one of a nitrogen atom and a phosphorus atom.

In one embodiment of the present disclosure, $R_1$ is

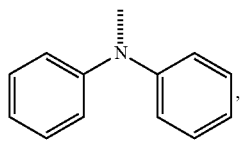

$R_2$ is a hydrogen atom, X is a carbon atom, Y is a nitrogen atom, and finally a first target compound as shown below is obtained.

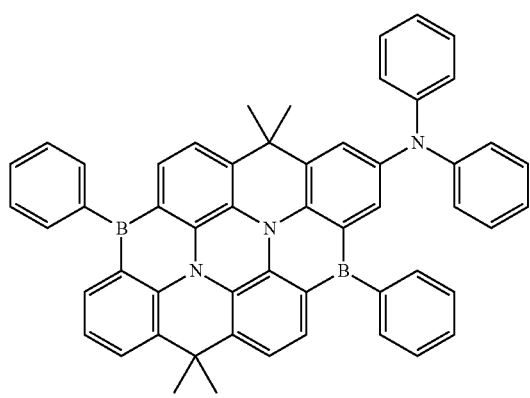 [SMILES: CC1(C)c2cccc3c2N2c4c(ccc5c4N4c6c(cc(N(c7ccccc7)c7ccccc7)cc6C5(C)C)B(c5ccccc5)c5ccc1c2c54)B3c1ccccc1]

In one embodiment of the present disclosure, a synthetic route of the first target compound is shown below:

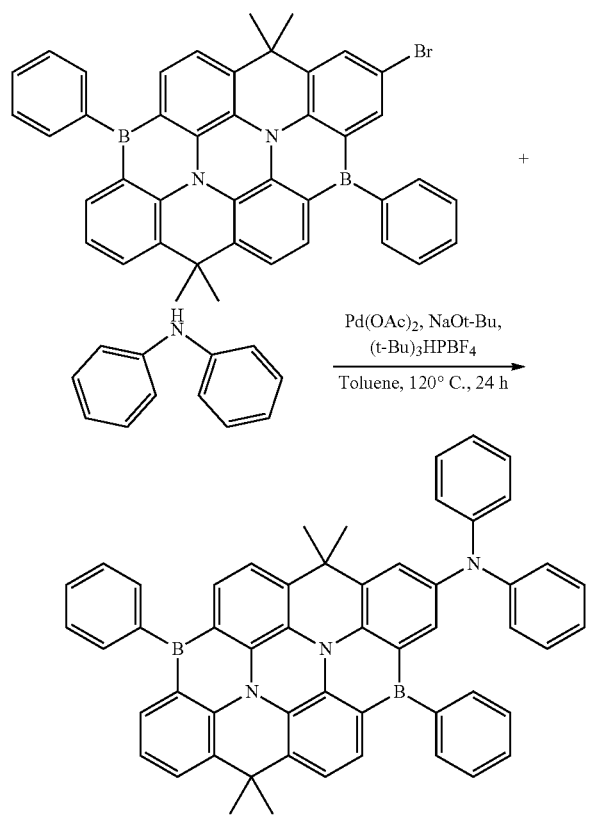

It specifically includes the following synthesis steps:

First, a first raw material compound (3.32 g, 5 mmol) was added into a 150 mL two-neck bottle. The molecular structure of the first raw material compound is as follows:

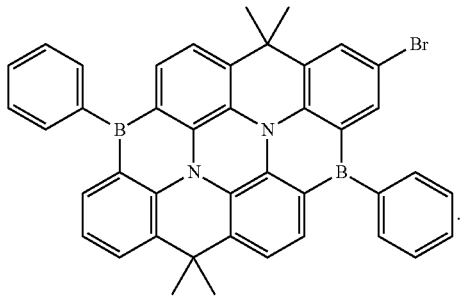 [SMILES: CC1(C)c2cccc3c2N2c4c(ccc5c4N4c6c(cc(Br)cc6C5(C)C)B(c5ccccc5)c5ccc1c2c54)B3c1ccccc1]

The first raw material compound is available on the market.

Next, diphenylamine (1.01 g, 6 mmol), a catalyst palladium acetate Pd(OAc)$_2$ (90 mg, 0.4 mmol), and tri-tert-butylphosphine tetrafluoroborate (t-Bu)$_3$HPBF$_4$ (0.34 g, 1.2 mmol) were sequentially added.

Next, sodium tert-butoxide (NaOt-Bu, 1.16 g, 12 mmol) was added into the glove box, and 60 mL of toluene that had been dewatered and deoxygenated was poured into the glove box under an argon atmosphere. The reaction was carried out for 12-48 hours under 100-160° C., and preferably at 120° C. for 24 hours. Finally, the reaction solution was poured into 300 mL ice water after being cooled to room temperature, and then extracted with dichloromethane for 2-3 times. The collected organic phases were combined, followed by being purified and isolated with a silica gel by a column chromatography (dichloromethane:hexane, v:v, 1:1) to obtain 2.3 g powder with blue-white color and a yield of 61%. It is characterized that a mass spectrometry "MS (EI) m/z: 753.30" confirmed that the obtained product was the first target compound.

In one embodiment of the present disclosure, a molar ratio of the first raw material compound to the diphenylamine ranges from 1:1 to 1:3, and preferably 1:1.2. A molar ratio of the first raw material compound to the palladium acetate to the tri-tert-butylphosphine tetrafluoroborate ranges from 1:0.04:0.12 to 1:0.12:0.36, and preferably 1:0.08:0.24. A molar ratio of the first raw material compound to sodium tert-butoxide ranges from 1:1 to 1:3, and preferably 1:2.4. A proportion of the first raw material compound to toluene solvent is 1 mmol of the first raw material compound to 8-20 ml of toluene solvent, and preferably 12 ml.

Embodiment 2

The second embodiment of the present disclosure differs from the first embodiment of the present disclosure only in that: $R_1$ is

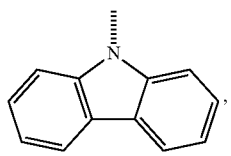

and finally the following second target compound is obtained.

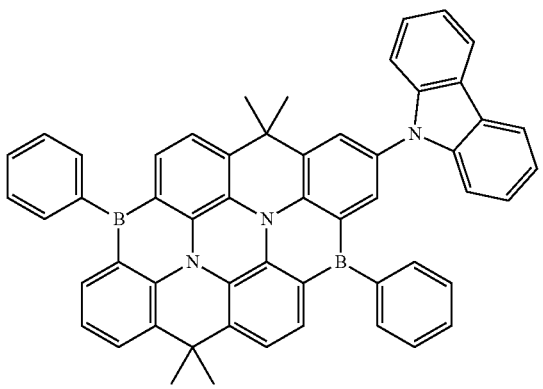 [SMILES: CC1(C)c2cccc3c2N2c4c(ccc5c4N4c6c(cc(-n7c8ccccc8c8ccccc87)cc6C5(C)C)B(c5ccccc5)c5ccc1c2c54)B3c1ccccc1]

In one embodiment of the present disclosure, the second target compound is synthesized by the following synthetic route:

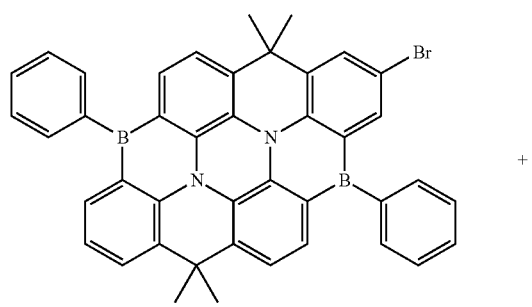

+

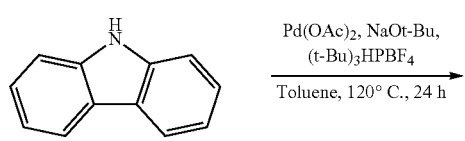

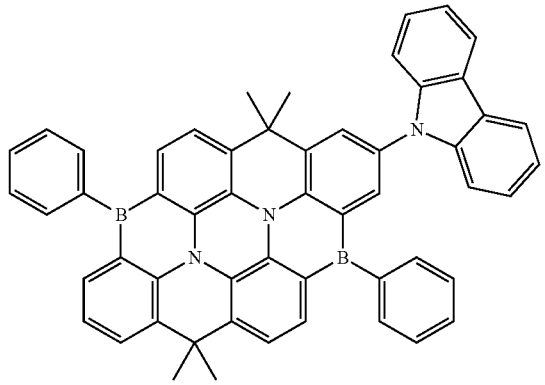

It specifically includes the following synthesis steps:

First, a first raw material compound (3.32 g, 5 mmol) was added into a 150 mL two-neck bottle. Next, carbazole (1.00 g, 6 mmol), a catalyst palladium acetate Pd(OAc)$_2$ (90 mg, 0.4 mmol), and tri-tert-butylphosphine tetrafluoroborate (t-Bu)$_3$HPBF$_4$ (0.34 g, 1.2 mmol) were sequentially added.

Next, sodium tert-butoxide (NaOt-Bu, 1.16 g, 12 mmol) was added into the glove box, and 60 mL of toluene that had been dewatered and deoxygenated was poured into the glove box under an argon atmosphere. The reaction was carried out for 12-48 hours under 100-160° C., and preferably at 120° C. for 24 hours. Finally, the reaction solution was poured into 300 mL ice water after being cooled to room temperature, and then extracted with dichloromethane for 2-3 times. The collected organic phases were combined, followed by being purified and isolated with a silica gel by a column chromatography (dichloromethane:hexane, v:v, 1:1) to obtain 2.4 g powder with blue-white color and a yield of 64%. It is characterized that a mass spectrometry "MS (EI) m/z: 751.30" confirmed that the obtained product was the second target compound.

In one embodiment of the present disclosure, a molar ratio of the first raw material compound to the carbazole ranges from 1:1 to 1:3, and preferably 1:1.2. A molar ratio of the first raw material compound to the palladium acetate to the tri-tert-butylphosphine tetrafluoroborate ranges from 1:0.04:0.12 to 1:0.12:0.36, and preferably 1:0.08:0.24. A molar ratio of the first raw material compound to sodium tert-butoxide ranges from 1:1 to 1:3, and preferably 1:2.4. A proportion of the first raw material compound to toluene solvent is 1 mmol of the first raw material compound to 8-20 ml of toluene solvent, and preferably 12 ml.

Embodiment 3

The third embodiment of the present disclosure differs from the first embodiment of the present disclosure only in that: $R_1$ is

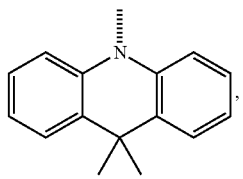

and finally the following third target compound is obtained.

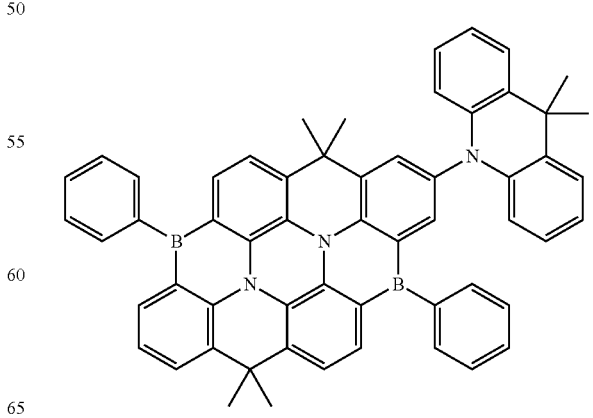

In one embodiment of the present disclosure, the third target compound is synthesized by the following synthetic route:

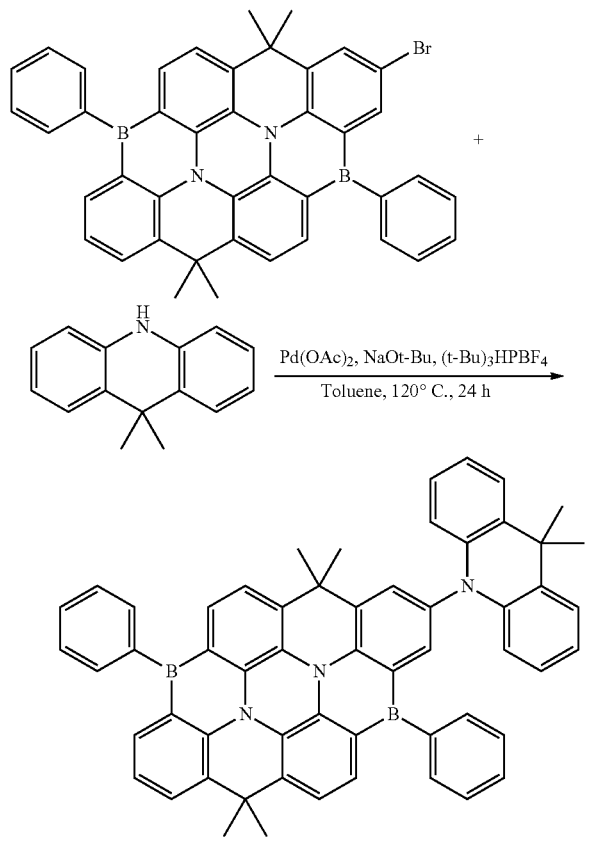

It specifically includes the following synthesis steps:

First, a first raw material compound (3.32 g, 5 mmol) was added into a 150 mL two-neck bottle. Next, 9,9-dimethyl-9,10-dihydroacridine (1.25 g, 6 mmol), a catalyst palladium acetate Pd(OAc)$_2$ (90 mg, 0.4 mmol), and tri-tert-butylphosphine tetrafluoroborate (t-Bu)$_3$HPBF$_4$ (0.34 g, 1.2 mmol) were sequentially added.

Next, sodium tert-butoxide (NaOt-Bu, 1.16 g, 12 mmol) was added into the glove box, and 60 mL of toluene that had been dewatered and deoxygenated was poured into the glove box under an argon atmosphere. The reaction was carried out for 12-48 hours under 100-160° C., and preferably at 120° C. for 24 hours. Finally, the reaction solution was poured into 300 mL ice water after being cooled to room temperature, and then extracted with dichloromethane for 2-3 times. The collected organic phases were combined, followed by being purified and isolated with a silica gel by a column chromatography (dichloromethane:hexane, v:v, 1:1) to obtain 2.6 g powder with blue-white color and a yield of 66%. It is characterized that a mass spectrometry "MS (EI) m/z: 793.21" confirmed that the obtained product was the third target compound.

In one embodiment of the present disclosure, a molar ratio of the first raw material compound to the 9,9-dimethyl-9,10-dihydroacridine ranges from 1:1 to 1:3, and preferably 1:1.2. A molar ratio of the first raw material compound to the palladium acetate to the tri-tert-butylphosphine tetrafluoroborate ranges from 1:0.04:0.12 to 1:0.12:0.36, and preferably 1:0.08:0.24. A molar ratio of the first raw material compound to sodium tert-butoxide ranges from 1:1 to 1:3, and preferably 1:2.4. A proportion of the first raw material compound to toluene solvent is 1 mmol of the first raw material compound to 8-20 ml of toluene solvent, and preferably 12 ml.

A lowest singlet state (S1), a lowest triplet state energy level (T1), and a lowest energy level difference between the singlet and triplet states of each of the blue-light thermally activated delayed fluorescent material molecules produced by the three specific embodiments in the present disclosure and the commonly used sky blue TADF material "Bis[4-(9,9-dimethyl-9,10-dihydroacridine)phenyl]sulfone (DMAC-DPS)" as comparison are shown below.

TABLE 1

|  | PL Peak (nm) | S1 (eV) | T1 (eV) | $\Delta E_{ST}$ (eV) |
|---|---|---|---|---|
| DMAC-DPS | 470 | 2.64 | 2.55 | 0.09 |
| Target compound 1 | 455 | 2.73 | 2.63 | 0.10 |
| Target compound 2 | 460 | 2.70 | 2.65 | 0.05 |
| Target compound 3 | 463 | 2.68 | 2.60 | 0.08 |

From Table 1, the blue emission peak in the comparison is at 470 nm, the lowest singlet state in the comparison is at 2.64 eV, the lowest triplet state in the comparison is at 2.55 eV, the lowest energy level difference between the singlet and triplet states in the comparison is 0.09 Ev. The first target compound, the second target compound, and the third target compound all have less emission peak than that of the comparison. That is, the first target compound, the second target compound, and the third target compound all can be used as a blue light guest material in an OLED device. Accordingly, the first target compound, the second target compound, and the third target compound all have the lowest energy level difference between the singlet and triplet states of less than 0.2 eV, which means that they all have stronger TADF effects.

As shown in FIG. 1, one embodiment of the present disclosure further provides an electroluminescent device 100, including: a substrate layer 101, a hole injection layer 102, a hole transport layer 103, a light-emitting layer 104, an electron transport layer 105, and a cathode layer 106.

It is characterized that the hole injection layer 102 is disposed on a side surface of the substrate layer 101. The hole injection layer 102 is for injecting holes into an OLED device from a cathode. The hole transport layer 103 is disposed on a side surface of the hole injection layer 102 away from the substrate layer 101. The hole transport layer 103 is used for transporting the holes that are injected into the OLED device from the hole injection layer 102 to the light-emitting layer. The light-emitting layer 104 is disposed on a side surface of the hole transport layer 103 away from the hole injection layer 102. The holes and electrons are coupled within the light-emitting layer 104 to transmit energy to the luminescent material to excite the luminescent material to an exited state. When the luminescent material returns from the excited state to the ground state spontaneously, it emits blue light through radiation transition. The electron transport layer 105 is disposed on a side surface of the light-emitting layer 104 away from the hole transport layer 103. The electron transport layer 105 is used for transporting the electrons injected into the OLED device by the electron injection layer to the light-emitting layer 104. The cathode layer 106 is disposed on a side surface of the electron transport layer 105 away from the light-emitting layer 104. The cathode layer 106 is used for injecting the electrons and serves as a total reflection cathode.

In one embodiment of the present disclosure, the substrate layer 101 is a glass substrate on which a layer of conductive indium tin oxides is coated. A material of the hole injection layer 102 may be 1,4,5,8,9,11-hexaazabenzonitrile (HATCN), a material of the hole transport layer 103 may be 4,4',4''-tris(carbazol-9-yl)triphenylamine (TCTA), a material of the electron transport layer 105 may be 1,3,5-tris(3-(3-pyridyl)phenyl)benzene (Tm3PyPB), a material of the cathode layer 106 may be lithium fluoride/aluminum, and a material of the light-emitting layer 104 may be bis[2-((oxo)diphenylphosphino)phenyl] ether (DPEPO): DMAC-DPS or the blue-light thermally activated delayed fluorescent material in the embodiments of the present disclosure.

Figure 2:
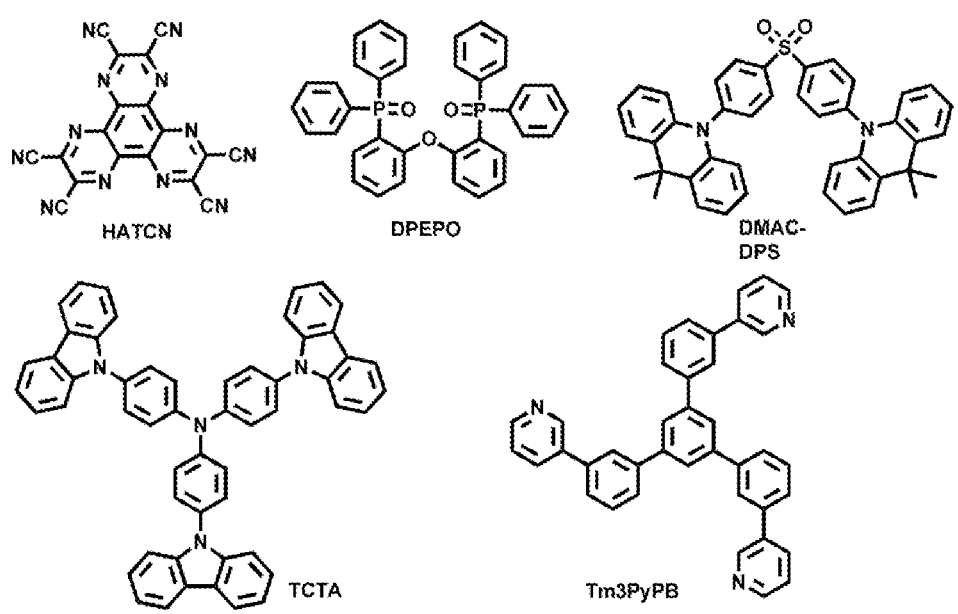
FIG. 2 shows structural formulas of molecules in a part of layers of an electroluminescent device provided by one embodiment of the present disclosure.

As shown in FIG. 2, which shows structural formulas of molecules in a part of layers of an electroluminescent device provided by one embodiment of the present disclosure molecular structural formula. It is characterized that the structural formulas of molecules include: 1,4,5,8,9,11-hexaazabenzonitrile (HATCN), 4,4',4''-tris(carbazol-9-yl)triphenylamine (TCTA), 1,3,5-tris(3-(3-pyridyl)phenyl)benzene (Tm3PyPB), bis[2-((oxo)diphenylphosphino)phenyl] ether (DPEPO), and DMAC-DPS.

In one embodiment of the present disclosure, the electroluminescent device can be obtained by the method known in the art, for example, by a method disclosed in a reference "Adv. Mater. 2003, 15, 277". The specific process may be: Under high vacuum, on a cleaned conductive glass (ITO) substrate, HATCN, TCTA, DPEPO+blue-light thermally activated delayed fluorescent material, Tm3PyPB, LiF with 1 nm thickness, and Al with 100 nm thickness were sequentially deposited by evaporation.

Specifically, the electroluminescent device A1, the electroluminescent device A2, the electroluminescent device A3, and the electroluminescent device A4 were produced by using sky blue light TADF material Bis[4-(9,9-dimethyl-9,10-dihydroacridine)phenyl] sulfone (DMAC-DPS), the first target compound, the second target compound, and the third target compound. The structures of the electroluminescent device A1 to the electroluminescent device A4, which include the substrate layer 101 to the cathode layer 106, are sequentially shown as below:

In the electroluminescent device A1, the substrate layer 101 may be ITO, the hole injection layer 102 may be 1,4,5,8,9,11-hexaazabenzonitrile with 5 nm thickness, the hole transport layer 103 may be 4,4',4''-tris(carbazol-9-yl)triphenylamine with 35 nm thickness, the electron transport layer may be 1,3,5-tris(3-(3-pyridyl)phenyl)benzene with 40 nm thickness, and the cathode layer 106 may be a composite layer composed of LiF with 1 nm thickness and Al with 100 nm thickness.

It is characterized that the light-emitting layer 104 may be DPEPO:DMAC-DPS (10%, 20 nm).

In the electroluminescent device A2, the substrate layer 101 may be ITO; the hole injection layer 102 may be 1,4,5,8,9,11-hexaazabenzonitrile with 5 nm thickness, the hole transport layer 103 may be 4,4',4''-tris(carbazol-9-yl)triphenylamine with 35 nm thickness, the electron transport layer may be 1,3,5-tris(3-(3-pyridyl)phenyl)benzene with 40 nm thickness, and the cathode layer 106 may be a composite layer composed of LiF with 1 nm thickness and Al with 100 nm thickness.

It is characterized that the light-emitting layer 104 may be DPEPO: the first target compound (10%, 20 nm).

In the electroluminescent device A3, the substrate layer 101 may be ITO, the hole injection layer 102 may be 1,4,5,8,9,11-hexaazabenzonitrile with 40 nm thickness, the hole transport layer 103 may be 4,4',4''-tris(carbazol-9-yl)triphenylamine with 35 nm thickness, the electron transport layer may be 1,3,5-tris(3-(3-pyridyl)phenyl)benzene with 40 nm thickness, and the cathode layer 106 may be a composite layer composed of LiF with 1 nm thickness and Al with 100 nm thickness.

It is characterized that the light-emitting layer 104 may be DPEPO: the second target compound (10%, 20 nm).

In the electroluminescent device A4, the substrate layer 101 may be ITO, the hole injection layer 102 may be 1,4,5,8,9,11-hexaazabenzonitrile with 5 nm thickness, the hole transport layer 103 may be 4,4',4''-tris(carbazol-9-yl)triphenylamine with 35 nm thickness, the electron transport layer may be 1,3,5-tris(3-(3-pyridyl)phenyl)benzene with 40 nm thickness, and the cathode layer 106 may be a composite layer composed of LiF with 1 nm thickness and Al with 100 nm thickness.

It is characterized that the light-emitting layer 104 may be DPEPO: the third target compound (10%, 20 nm).

Specifically, performance data of the electroluminescent device A1 to the electroluminescent device A4 are shown in Table 2, in which the current, brightness, and potential of the electroluminescent device were measured by Keithley source measurement system with a calibrated silicon photodiode (Keithley 2400 Sourcemeter, Keithley 2000 Currentmeter) and the electroluminescence spectrum was measured by French company JY SPEX CCD3000 spectrometer. All measurements were performed at room temperature in the atmosphere.

TABLE 2

| Electroluminescent device | Luminescent material | Maximum current efficiency | EL peak (nm) | Maximum external quantum efficiency(%) |
|---|---|---|---|---|
| Device A1 | DMAC-DPS | 25.6 | 470 | 19.1% |
| Device A2 | first target compound | 26.8 | 455 | 23.1% |
| Device A3 | second target compound | 30.5 | 460 | 25.1% |
| Device A4 | third target compound | 33.6 | 463 | 26.8% |

It can be seen from above table that each of the electroluminescent device A2 produced by the first target compound, the electroluminescent device A3 produced by the second target compound, and the electroluminescent device A4 produced by the third target compound has the maximum current efficiency and the maximum external quantum efficiency both higher than the electroluminescent device A1 in the comparison. It fully shows that the material designed by the present disclosure has excellent luminescence performance.

The embodiments of the present disclosure does not specifically limit the application of the electroluminescent device 100, and it may be applications such as TVs, laptops, tablets, wearable display devices (such as smart bracelets, smart watches, etc.), mobile phones, virtual reality devices, augmented reality devices, vehicle displays, advertising light boxes, and other products or components with display functions.

In summary, the electroluminescent device 100 provided by the embodiment of the present disclosure uses the blue-light thermally activated delayed fluorescent material according to the present disclosure as being the light-emitting layer 104 to solve the problem of low theoretical internal quantum efficiency of fluorescent materials, thereby improving the luminous efficiency of the electroluminescent device. Embodiments of the present disclosure provide a blue-light thermally activated delayed fluorescent material having a molecular structure of electron donors in combination with electron acceptors. Upon collocation of different functional groups, based on the structure of triphenyl borane and triphenyl amine, by adjusting the structure of different electron-donating units, the overall charge transfer strength is adjusted, and the electron-donating ability is changed, so as to obtain a series of blue-light thermally activated delayed fluorescent materials having a lower energy level difference between singlet and triplet states, a higher luminous efficiency, and an accelerated reverse intersystem crossing constant. Moreover, the fine-tuning of the electron-donating ability of the electron donating units can be realized to achieve the fine-tuning of the spectrum, which effectively increases the luminous efficiency of the materials. Additionally, the effect of the strength of the charge transfer state on the material performance is studied, so that the electroluminescent devices based on the target blue-light thermally activated delayed fluorescent material have extremely high efficiency, and the luminous efficiency of the organic electroluminescent device is improved.

In the abovementioned embodiments, the description of each embodiment has its own emphasis. For parts that are not described in detail in an embodiment, reference may be made to related descriptions of other embodiments.

A fluorescent material and an electroluminescent device provided in the embodiments of the present disclosure are described in detail above. Specific examples are used for explaining the principles and implementation of the present disclosure. The descriptions of the above embodiments are only for helping one to understand the method of this disclosure and its core concept. Those of ordinary skill in the art should understand that: they can still modify the technical solutions in the foregoing embodiments, or equivalently replace some of the technical features. However, these modifications or replacements do not cause the essence of the corresponding technical solutions to deviate from the scope of the technical solutions of the embodiments of the present disclosure.

What is claimed is:

1. A fluorescent material, comprising a structural formula of:

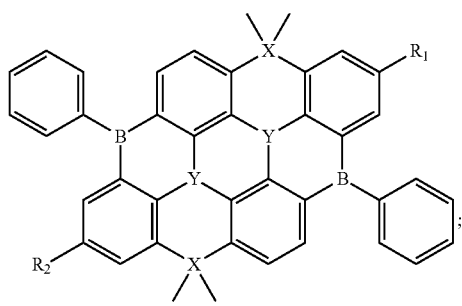

wherein $R_1$ is selected from the group consisting of

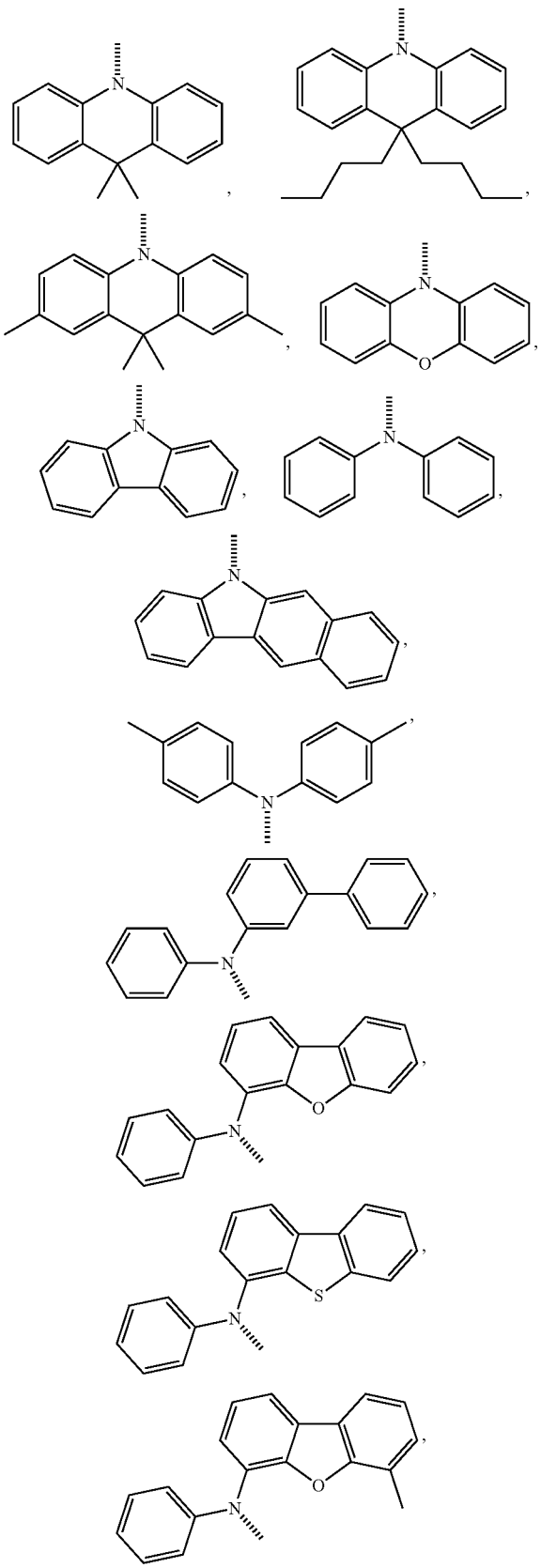

-continued

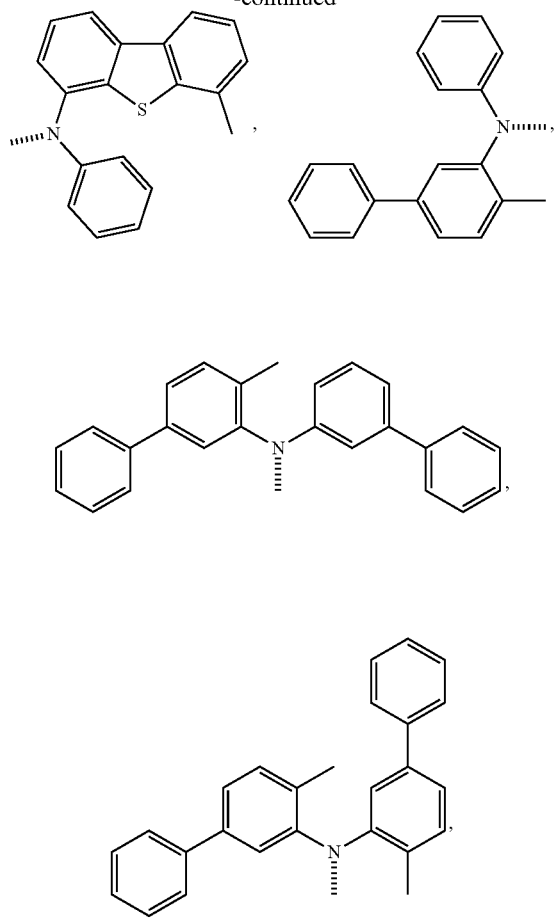

and any derivatives thereof;

R$_2$ is selected from the group consisting of a hydrogen atom, a fluorine atom, a methyl group, a cyano group, a tert-butyl group, a phenyl group, a pyridine group, a 1,3,5-triazine group, and any derivatives thereof;

X is any one of a carbon atom or a silicon atom; and

Y is any one of a nitrogen atom or a phosphorus atom.

2. The fluorescent material according to claim 1, wherein the fluorescent material includes a first target compound having a structural formula of:

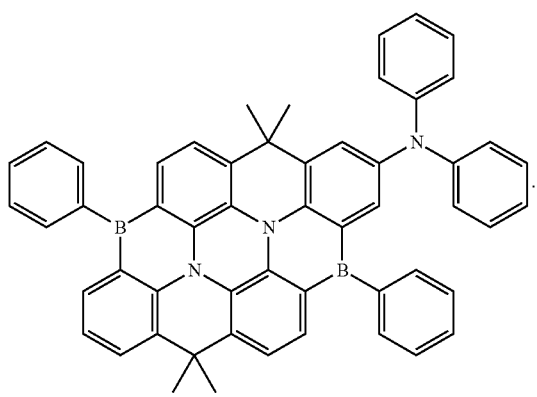 [SMILES: CC1(C)c2cccc3c2N2c4c(ccc5c4N4c6c(cc(N(c7ccccc7)c7ccccc7)cc6C5(C)C)B(c5ccccc5)c5ccc1c2c54)B3c1ccccc1]

3. The fluorescent material according to claim 2, wherein a synthetic route of the first target compound is:

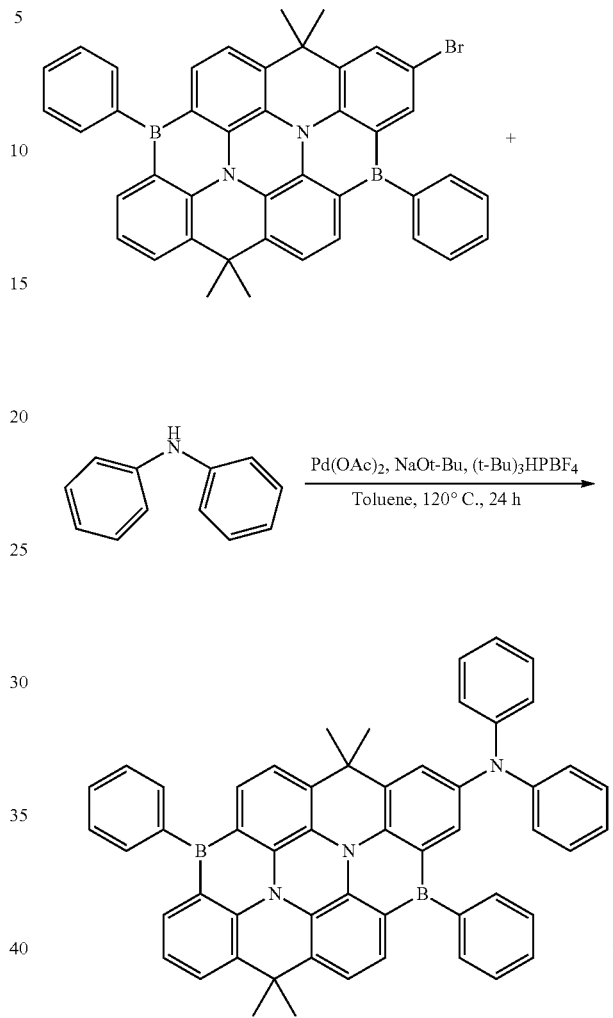

4. The fluorescent material according to claim 1, wherein the fluorescent material includes a first target compound, wherein the second target compound has a structural formula of:

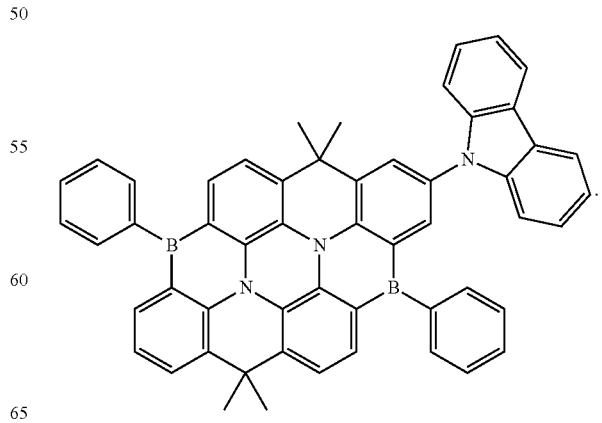

5. The fluorescent material according to claim 4, wherein a synthetic route of the second target compound is:

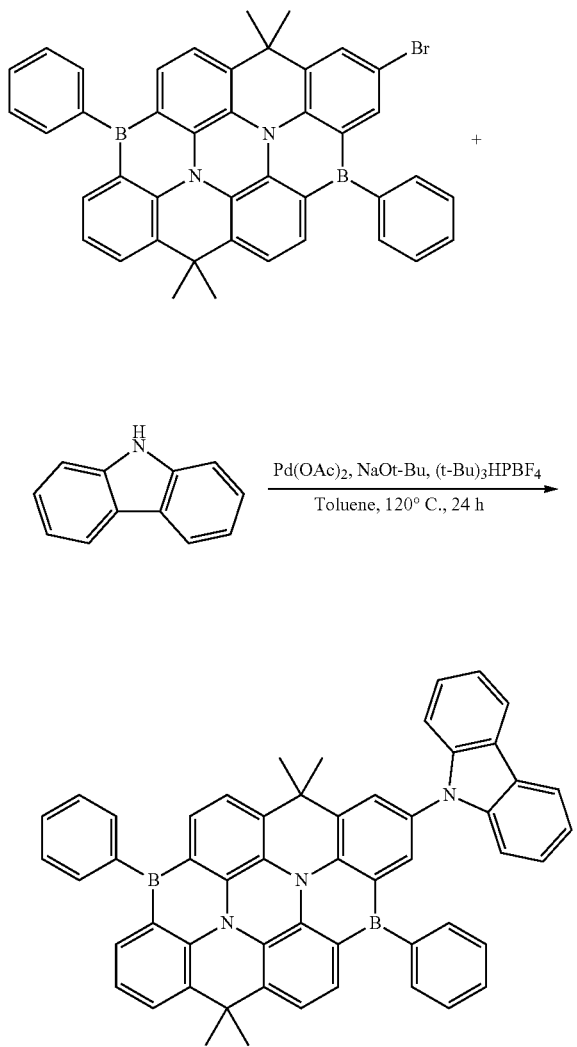

6. The fluorescent material according to claim 1, wherein the fluorescent material includes a third target compound having a structural formula of

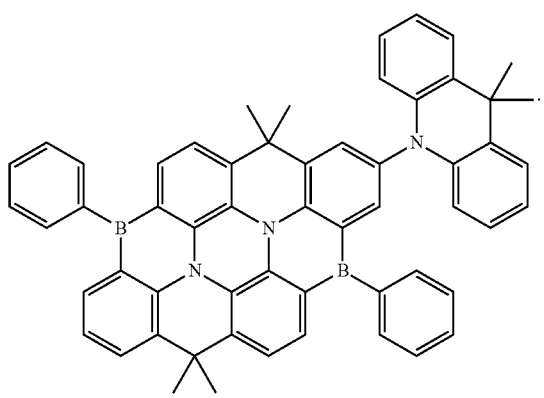 [SMILES: CC1(C)c2ccccc2N(c2cc3c4c(c2)C(C)(C)c2ccc5c6c2N4c2c(ccc4c2N6c2c(cccc2C4(C)C)B5c2ccccc2)B3c2ccccc2)c2ccccc21]

7. The fluorescent material according to claim 6, wherein the third target compound is synthesized by the following synthetic route:

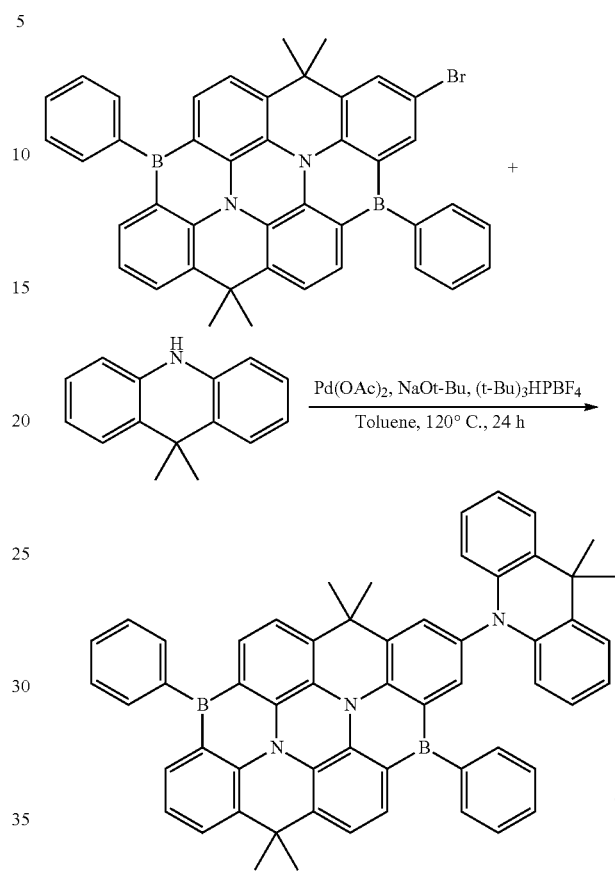

8. The fluorescent material according to claim 7, wherein the third target compound has a blue emission peak at 463 nm, the third target compound has a lowest singlet state at 2.68 eV, the third target compound has a lowest triplet state at 2.6 eV, and the third target compound has a lowest energy level difference between singlet and triplet states of 0.08 Ev.

9. An electroluminescent device, comprising a light-emitting layer, wherein a material of the light-emitting layer includes a fluorescent material having a structural formula of:

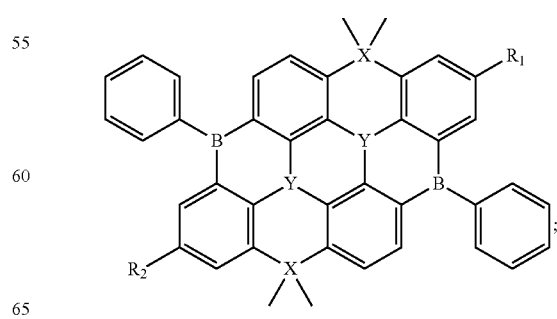

wherein, $R_1$ is selected from the group consisting of

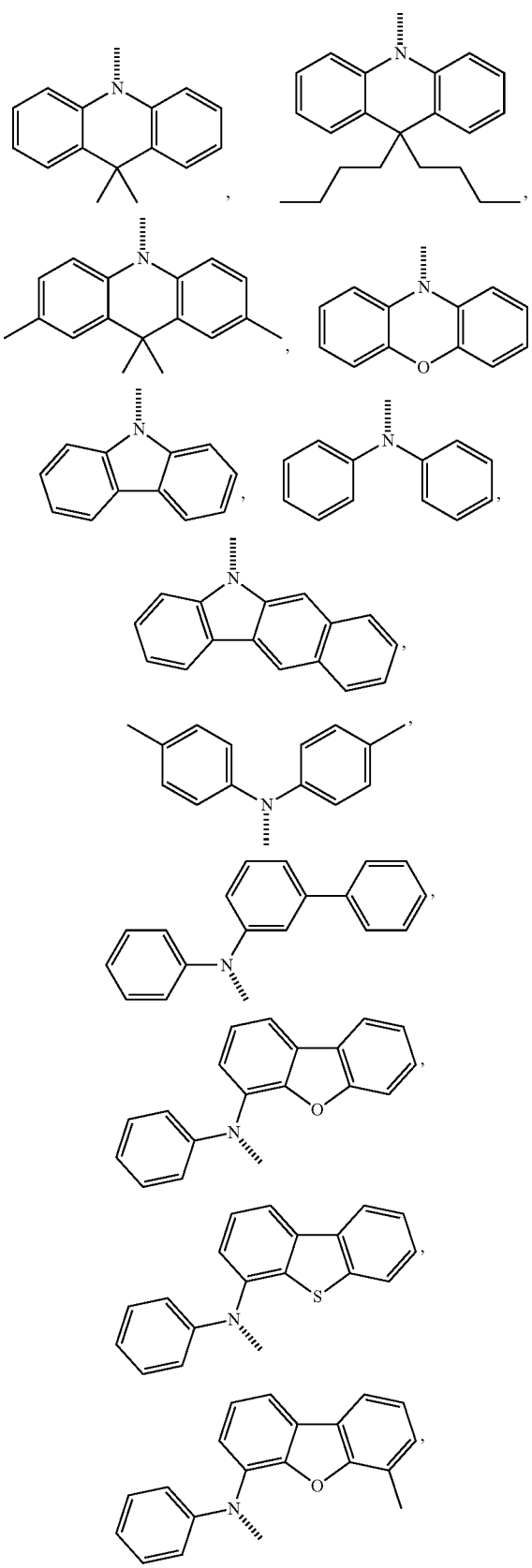

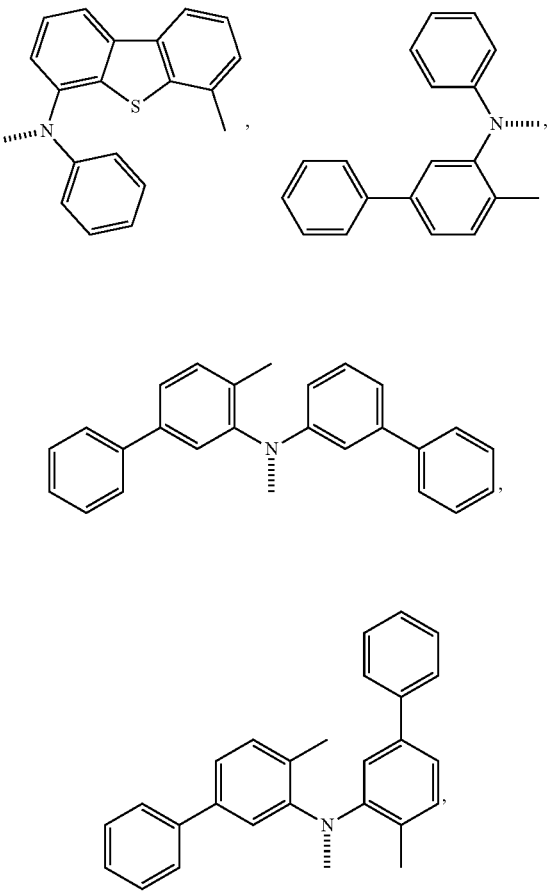

and any derivatives thereof;

$R_2$ is selected from the group consisting of a hydrogen atom, a fluorine atom, a methyl group, a cyano group, a tert-butyl group, a phenyl group, a pyridine group, a 1,3,5-triazine group, and any derivatives thereof;

X is any one of a carbon atom or a silicon atom; and

Y is any one of a nitrogen atom or a phosphorus atom.

10. The electroluminescent device according to claim 9, wherein the fluorescent material includes a first target compound having a structural formula of:

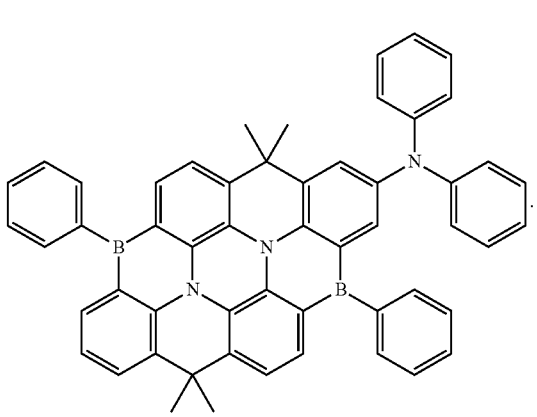 [SMILES: CC1(C)c2cccc3c2N2c4c(ccc5c4N4c6c(cc(N(c7ccccc7)c7ccccc7)cc6C5(C)C)B(c5ccccc5)c5ccc1c2c54)B3c1ccccc1]

11. The electroluminescent device according to claim 10, wherein a synthetic route of the first target compound is:

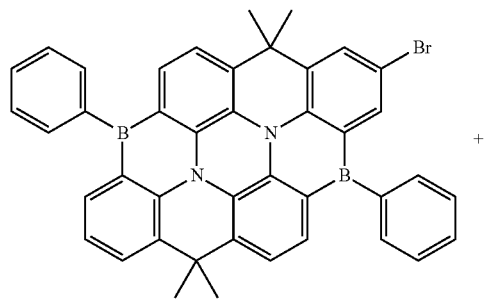

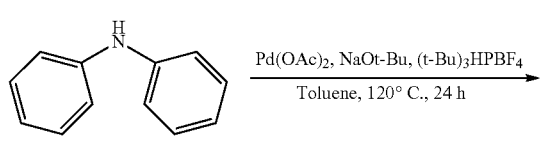

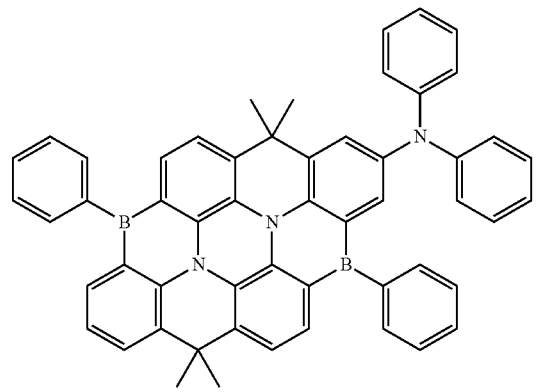

12. The electroluminescent device according to claim 9, wherein the fluorescent material includes a second target compound having a structural formula of:

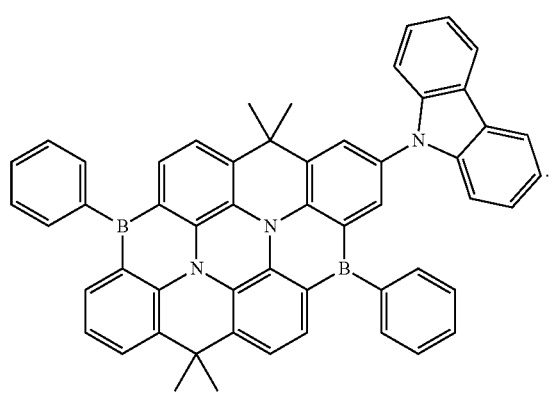 [SMILES: CC1(C)c2cccc3c2N2c4c(ccc5c4N4c6c(cc(-n7c8ccccc8c8ccccc87)cc6C5(C)C)B(c5ccccc5)c5ccc1c2c54)B3c1ccccc1]

13. The electroluminescent device according to claim 12, wherein a synthetic route of the second target compound is:

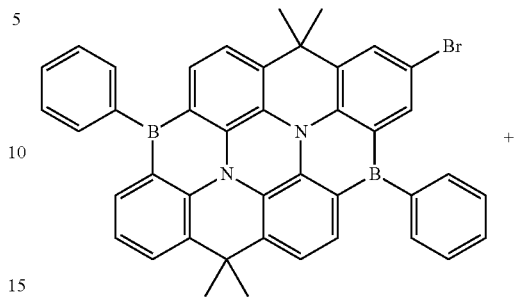

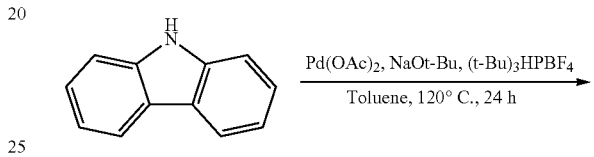

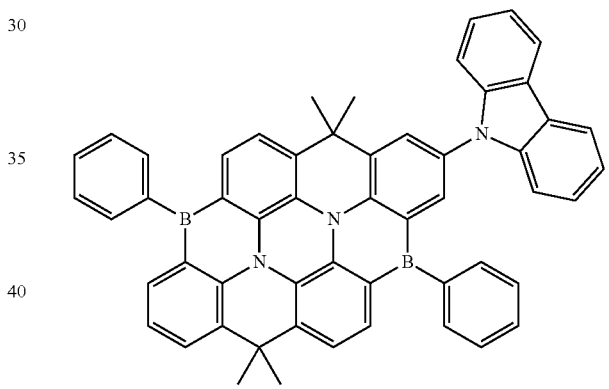

14. The electroluminescent device according to claim 9, wherein the fluorescent material includes a third target compound having a structural formula of:

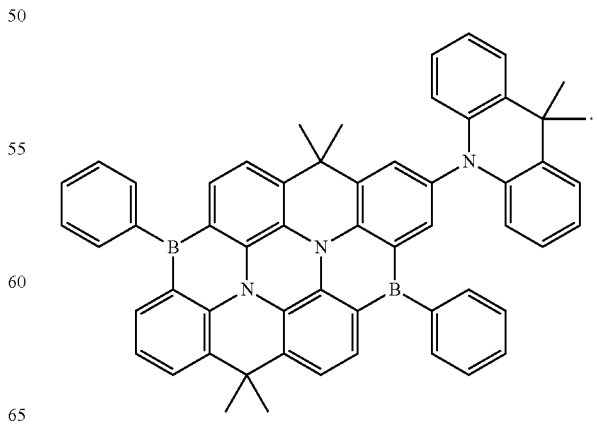

15. The electroluminescent device according to claim 14, wherein the third target compound is synthesized by the following synthetic route:

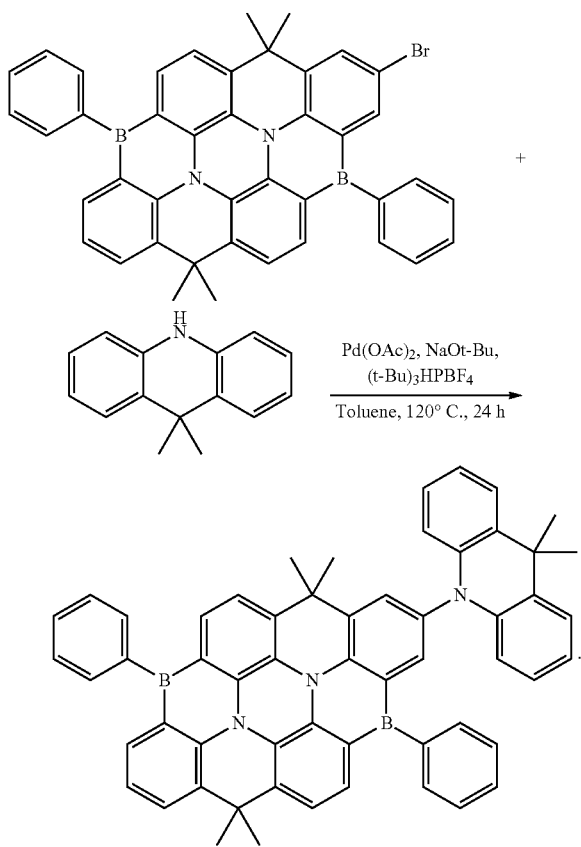

16. The fluorescent material according to claim 15, wherein the third target compound has a blue emission peak of 463 nm, the third target compound has a lowest singlet state at 2.68 eV, the third target compound has a lowest triplet state at 2.6 eV, and the third target compound has a lowest energy level difference between singlet and triplet states of 0.08 Ev.

17. The electroluminescent device according to claim 16, wherein the electroluminescent device further comprises:
a substrate layer;
a hole injection layer disposed on a side surface of the substrate layer;
a hole transport layer disposed on a side surface of the hole injection layer away from the substrate layer;
the light-emitting layer disposed on a side surface of the hole transport layer away from the hole injection layer;
an electron transport layer disposed on a side surface of the light-emitting layer away from the hole transport layer; and
a cathode layer disposed on a side surface of the electron transport layer away from the light-emitting layer.

18. The electroluminescent device according to claim 17, wherein a material of the substrate layer is indium tin oxide, a material of the hole injection layer is 1,4,5,8,9,11-hexaazabenzonitrile, a material of the hole transport layer is 4,4',4"-tris(carbazol-9-yl)triphenylamine, a material of the electron transport layer is 1,3,5-tris(3-(3-pyridyl)phenyl)benzene, and a material of the cathode layer is lithium fluoride/aluminum.

19. The electroluminescent device according to claim 18, wherein a material of the light-emitting layer includes a mixed material composed of bis[2-((oxo)diphenylphosphino)phenyl] ether and the third target compound, wherein the third target compound is 10% by mass of the mixed material.

20. The electroluminescent device according to claim 19, wherein a maximum external quantum efficiency of the electroluminescent device is 26.8%.

* * * * *